United States Patent
Przadka

(10) Patent No.: US 7,795,728 B2
(45) Date of Patent: Sep. 14, 2010

(54) ELECTRONIC COMPONENT

(75) Inventor: Andreas Przadka, Munich (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 10/521,253

(22) PCT Filed: May 7, 2003

(86) PCT No.: PCT/DE03/01465

§ 371 (c)(1),
(2), (4) Date: Jun. 17, 2005

(87) PCT Pub. No.: WO04/001963

PCT Pub. Date: Dec. 31, 2003

(65) Prior Publication Data

US 2005/0230812 A1    Oct. 20, 2005

(30) Foreign Application Priority Data

Jun. 25, 2002    (DE) .................... 102 28 328

(51) Int. Cl.
*H01L 23/64*    (2006.01)
(52) U.S. Cl. .............. 257/724; 257/723; 257/728; 257/E25.029; 361/729; 361/734; 361/807; 361/811
(58) Field of Classification Search .............. 257/723, 257/724, 728; 361/729, 734, 807, 811
See application file for complete search history.

(56) References Cited

U.S. PATENT DOCUMENTS

| | | | |
|---|---|---|---|
| 5,459,368 A | | 10/1995 | Onishi et al. |
| 5,818,699 A | * | 10/1998 | Fukuoka .................. 361/760 |
| 5,889,325 A | * | 3/1999 | Uchida et al. ............. 257/724 |
| 6,060,954 A | * | 5/2000 | Liu et al. ................... 331/99 |
| 6,081,171 A | * | 6/2000 | Ella ......................... 333/189 |
| 6,091,310 A | * | 7/2000 | Utsumi et al. .............. 333/12 |
| 6,150,615 A | * | 11/2000 | Suzuki ..................... 174/260 |
| 6,154,940 A | | 12/2000 | Onishi et al. |
| 6,274,937 B1 | * | 8/2001 | Ahn et al. ................. 257/777 |
| 6,356,453 B1 | * | 3/2002 | Juskey et al. ............. 361/760 |
| 6,388,207 B1 | * | 5/2002 | Figueroa et al. .......... 174/262 |
| 6,407,929 B1 | * | 6/2002 | Hale et al. ................ 361/763 |

(Continued)

FOREIGN PATENT DOCUMENTS

EP    0 637 871    8/1994

(Continued)

OTHER PUBLICATIONS

Charles Harper, Electronic Packaging and Interconnection Handbook, 1991, McGraw-Hill, pp. 1.59-1.59.*

(Continued)

*Primary Examiner*—Davienne Monbleau
*Assistant Examiner*—Eduardo A Rodela
(74) *Attorney, Agent, or Firm*—Fish & Richardson P.C.

(57) ABSTRACT

An electronic component includes a multi-layer substrate having an upper side and under side, and at least one integrated impedance converter. The electronic component also includes at least one chip component having external contacts. The at least one chip component is disposed on the upper side of the multi-layer substrate, and is electrically connected to the at least one integrated impedance converter.

26 Claims, 4 Drawing Sheets

U.S. PATENT DOCUMENTS

| | | | |
|---|---|---|---|
| 6,628,178 B2 | 9/2003 | Uchikoba | |
| 6,642,811 B2 * | 11/2003 | Daniels et al. | 333/181 |
| 6,673,697 B2 * | 1/2004 | Ma et al. | 438/455 |
| 6,713,860 B2 * | 3/2004 | Li | 257/700 |
| 6,757,178 B2 * | 6/2004 | Okabe et al. | 361/793 |
| 6,889,155 B2 * | 5/2005 | Ogino et al. | 702/113 |
| 6,955,948 B2 * | 10/2005 | Asahi et al. | 438/125 |
| 6,970,362 B1 * | 11/2005 | Chakravorty | 361/782 |
| 7,190,083 B1 * | 3/2007 | Cave et al. | 257/728 |
| 2002/0011907 A1 | 1/2002 | Yamada et al. | |
| 2002/0044030 A1 | 4/2002 | Uchikoba | |
| 2003/0107056 A1 * | 6/2003 | Chin et al. | 257/211 |

FOREIGN PATENT DOCUMENTS

| | | |
|---|---|---|
| EP | 0 637 871 | 2/1995 |
| JP | 05-183273 | 7/1993 |
| JP | 07-099420 | 4/1995 |
| JP | 2001-244375 | 9/2001 |
| JP | 2002-111218 | 4/2002 |
| WO | WO00/54337 | 9/2000 |

OTHER PUBLICATIONS

Office Action in corresponding Application No. CN03814933.8, dated Jan. 18, 2008.

Examination Report in Application No. JP2004-514540, dated Oct. 30, 2008.

Dally et al., "Balanced Transmission Lines", in *Digital Systems Engineering*, Cambridge Univ. Press, Ch. 3.4.2, pp. 108-111 & 114, (1998).

Wikipedia Search for "Balanced Line", [online] Retrieved from the Internet:<URL:http://en.wikipedia.org/wiki/Balanced_line> [retrieved on Sep. 3, 2009], 4 pgs. (2009).

Harley, R., "Balanced and Unbalanced Lines", in The Complete Guide to High-End Audio [online], Ch. 11, Pt. 7, Retrieved from the Internet: <URL:http://www.monstercable.com/RobertHarley/ch11_p07.asp>, [retrieved on Sep. 3, 2009]4 pgs. (1999).

Babin, P., "Balanced Line Drivers", in Basic Car Audio Electronics, [online] Retrieved from the Internet:<URL:http://www.bcael.com/ballndrv.htm>, [retrieved on Sep. 3, 2009], 7 pgs. (2008).

Balanced Line: Definition:, [online] Retrieved from the Internet:<URL:http://www.answers.com/topic/balanced-line>, [retrieved on Sep. 3, 2009], 4 pgs. (2008).

German-language translation of Office Action in corresponding Application No. CN03814933.8 (12 pages); English-language summary (4 pages); English-language translation of the German-language translation of the Office Action in corresponding Application No. CN03814933.8 (25 pages).

* cited by examiner

ELECTRONIC COMPONENT

The patent application relates to an electronic component or module having a chip component, especially a filter, and a multi-layer substrate, as well as a process for assembly of the chip component on the multi-layer substrate.

BACKGROUND

An electronic module is a highly-integrated component, which comprises one or more circuits monolithically integrated into a multi-layer substrate and fulfills various functions, in the terminal device of a mobile communication system, for example.

An electronic module can, for example, perform the function of an antenna circuit, a duplexer, a diplexer, a coupler, etc.

In addition to the integrated circuits, a module can contain one or more chip components as well as discrete circuit elements or components, which are disposed with the integrated circuit elements on the upper side of the multi-layer substrate.

It is frequently necessary to obtain a symmetrical signal at the output end of a chip component. To this end, either a balun can be integrated directly into the structure of the chip component, or a chip component having asymmetrical inputs and outputs and a downstream balun comprising discrete individual elements can be used. Such a balun can be executed as a compact, individual component.

To achieve a higher degree of integration, it is possible to arrange the chip component having upstream and downstream functional units on a shared dielectric substrate. In this manner, front end modules for time-duplexed systems such as GSM900/1800/1900 can be obtained, for example, when SAW filters (SAW=surface acoustic wave) are disposed on a multi-layer ceramic substrate together with the circuit elements of an antenna circuit. In this regard, the circuit elements of the antenna circuit can be partially integrated in the multi-layer substrate.

To achieve optimal signal transmission in the range of the pass band, it is necessary that the output impedance of a chip component be perfectly adjusted to the input impedance of the subsequent stage and/or that the input impedance of a chip component be perfectly adjusted to the output impedance of the upstream stage. Thus, to allow for their adjustment to their circuit environment, the chip components require an electric adjustment network. Such a network can comprise inductances, capacitances and delay lines, and its principal purpose is to adjust the impedance of a component to the external environment. It is known that an adjustment network can be executed, wherein the chip component, together with the discrete individual components, is soldered to a printed circuit board.

It is known that an SAW component having a multi-layer carrier substrate (made of ceramics, for example), which comprises integrated adjustment elements, can be attached and electrically connected by means of a flip-chip array or by means of wire bonding. See, for example, document U.S. Pat. No. 5,459,368. In addition to one or more SAW chips, additional passive or active, discrete circuit elements can be disposed on the upper side of the carrier substrate. However, the production of such components is complex and expensive, because SAW chips and/or so-called circuit elements are electrically connected with the carrier substrate by means of various connection methods.

If, for example, a chip component is connected in a reception branch in front of one or between two LNAs (low noise amplifier), the terminal impedance values that occur usually range between 50 and 200 Ohm. If the impedances of the upstage and downstage stages are known, it is essentially possible to execute the chip component in such a way that its input and/or output impedances correspond to the required values. In previously known chip components, the entire component had to be completely redeveloped for each application with the predetermined input and/or output impedance (e.g., 25, 50, 200 Ohm).

However, the range of available terminal impedances for components is often limited (especially in the case of SAW components).

External impedance converters equipped with discrete individual components can also be used. In the latter case, this results in an increase in space requirements. In addition, the reliability of the overall design suffers as a result of the required connection points.

SUMMARY

This application describes an electronic component, which comprises a) a multi-layer substrate, b) at least one chip component having external contacts, and c) at least one impedance converter (monolithically) integrated into the multi-layer substrate. At least one chip component is disposed on the upper side of the multi-layer substrate and is electrically connected with the impedance converter.

A chip component is defined as a "naked" chip having electronic structures or an embedded chip having such structures.

An impedance converter is defined herein as an electronic circuit which fulfills an impedance transformation, that is, which changes actual impedance values characteristic for a chip component or for all chip components of the same type to a predetermined reference value. At issue are not just significant differences between actual and reference impedance values (e.g., a multiplication of impedance from 50 to 200 Ohm), but also relatively small differences of less than 100%, but at least 5% between actual and reference impedance values (e.g., a change in impedance from 46 to 50 Ohm). In contrast, in the present application, an adjustment or impedance adjustment is defined as a desired change in impedance of no more than 5%, that is, offsetting a production-related defective adjustment.

An advantage of the component described herein is that the impedance converter required for an impedance transformation, in contrast to known solutions, is not disposed on a printed circuit board, but instead is integrated in the multi-layer substrate, wherein the same multi-layer substrate bears a chip component. The total space requirement is especially small in this arrangement, because the integration takes place in a vertical direction. A compact unit encompassing the multi-layer substrate having the integrated impedance converter guaranties the required impedance transformation and can be pre-manufactured by standard means. This unit can easily and quickly transform the characteristic actual impedance of chip components manufactured by standard means to a different required output impedance value. This eliminates the need for new development of the entire chip component, as well as the associated costs and time loss.

In and advantageous embodiment, the component described herein can also comprise one or more discrete passive or active circuit elements. In this case, the circuit elements are disposed on the upper side of the multi-layer substrate.

The discrete passive or active circuit elements can form at least a part of the following circuits: a high-frequent circuit, an adjustment circuit, an antenna circuit, a diode circuit, a transistor circuit, a high-pass filter, a low-pass filter, a band-pass filter, a band elimination filter, a power amplifier, a pre-amplifier, an LNA, a diplexer, a duplexer, a coupler, a directional coupler, a memory element, a balun, a mixer or an oscillator.

The integrated circuit elements can, for example, establish electric connections between an antenna and the band pass filters in the reception or transmission path of a component constructed as a diplexer and, furthermore, improve upon electric filter characteristics in general and, in particular, insulate the reception and transmission ports from one another.

The integrated circuit elements may be disposed in a multi-layer ceramic material, such as LTTC ceramics (=low temperature cofired ceramics). LTTC material allows for a high integration density of network elements. Alternatively, a multi-layer substrate can comprise layers of HTCC (=high temperature cofired ceramics), silicon and other semiconductors (e.g., GaAs, SiGe, silicon oxide, other oxides) or organic materials (e.g., laminates, plastic).

The multi-layer substrate has both internal electric terminals on the upper side, for contacting the chip component, of which there is generally one, and, if applicable, the discrete circuit element, of which there is generally one, as well as external electrodes on the lower side, to establish an electric connection between the component and an external printed circuit board, such as that of a terminal device.

In the following, the component is explained in greater detail on the basis of exemplary embodiments and the corresponding figures. The figures are provided for explanatory purposes only and are not true to scale. Identical elements are identified with the same reference numbers.

DETAILED DESCRIPTION

Figure 1A:
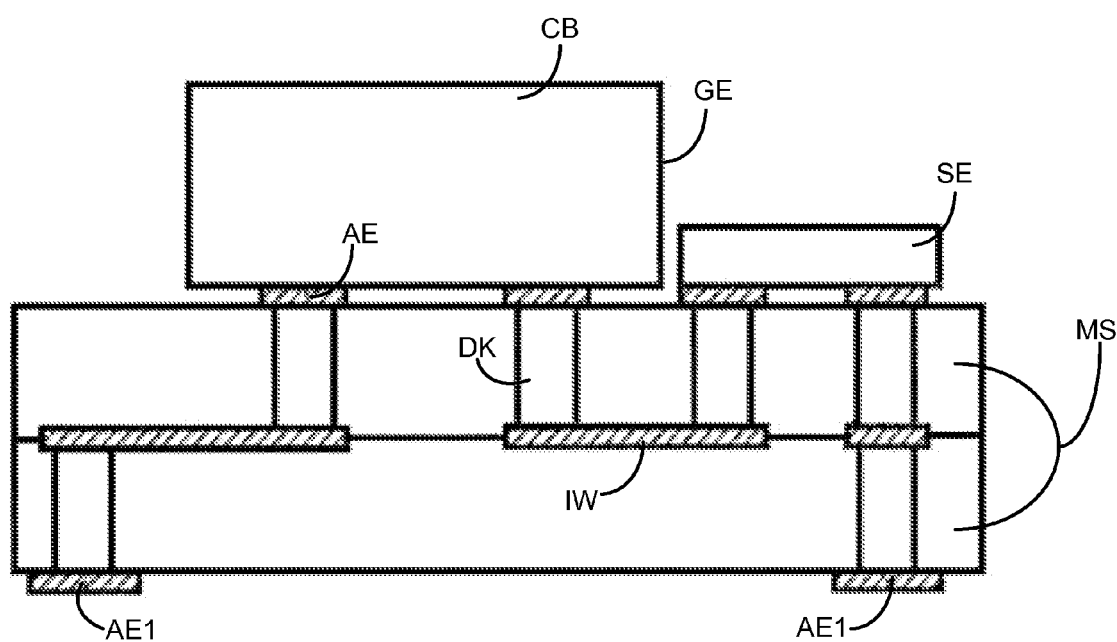
FIG. 1, comprised of FIGS. 1A, 1B and 1C, shows the basic structure of a component in schematic cross-section (FIGS. 1A and 1C) and top view (FIG. 1B).

The component shown in FIG. 1A is constructed as a multi-layer component having a multi-layer substrate MS, at least one chip component CB being disposed on the lower side of the multi-layer substrate. The chip component can be either a "naked" chip having electronic structures or a chip having a housing GE. It is possible that the chip component also contains a multi-layer substrate having integrated passive or active circuit elements.

In the context of this application, a passive or active circuit element is defined, in particular, as an inductance, a capacity, a delay line, a resistor, a diode or a transistor. In addition, a discrete passive or active circuit element can comprise any combination or the above-mentioned passive or active components in a compact component.

The chip component formed as a "naked" chip can be attached to the multi-layer substrate or electrically connected with the circuit elements integrated therein by means of bonding wire or flip-chip technology. The external contacts AE of a chip component can also be SMD contacts (SMD=surface mounted design/device).

The chip component can comprise one or more resonators operating with surface acoustic waves and/or bulk acoustic waves, known as SAW and/or BAW resonators or FBAR (SAW=surface acoustic wave, BAW=bulk acoustic wave, FBAR=thin film bulk acoustic wave resonator).

The chip component can be a chip having one or more filter circuits (filter chip), for example, SAW components such as SAW filters, BAW filters, LC chip filters, stripline filters (see, e.g., FIG. 1C) or microwave ceramic filters.

The at least one chip component CB is electrically connected with an impedance converter IW integrated in the multi-layer substrate MS. The multi-layer substrate can also contain at least one additional integrated circuit element. Another possibility includes a plurality of integrated circuit elements forming a part of the following circuits: a high-frequency circuit, an adjustment circuit, an antenna circuit, a diode circuit, a transistor circuit, a high-pass filter, a low-pass filter, a band-pass filter, a band elimination filter, a power amplifier, an LNA, a pre-amplifier, a diplexer, a duplexer, a coupler, a directional coupler, a memory element, a balun, a mixer or an oscillator.

In this regard, the integrated circuit elements may be formed, in a manner known in the art, as strip conductors or randomly shaped metal surfaces in, on or between the individual layers of the multi-layer substrate (substrate layers), as vertical feedthroughs DK in the multi-layer substrate, or as a combination of these elements. It is possible that a part of the integrated circuit elements—that is, at a part of an adjustment circuit—is formed, on the upper side of the multi-layer substrate for later fine-tuning by means, for example, of the partial removal of the existing strip conductors or by means of the subsequent addition of discrete circuit elements.

A plurality of the chip components disposed on the upper side of the multi-layer substrate can either have a shared impedance converter and/or a shared adjustment circuit or individual impedance converters and/or individual adjustment circuits.

The multi-layer substrate can contain, for example, layers of ceramic, silicon, oxides (e.g., silicon dioxide) or organic materials.

The external electrodes AE1 of the component on the lower side of the multi-layer substrate can constitute SMD contacts.

In addition, at least one discrete passive or active circuit element SE is visible on the lower side of the multi-layer substrate in FIG. 1A.

Figure 1B:
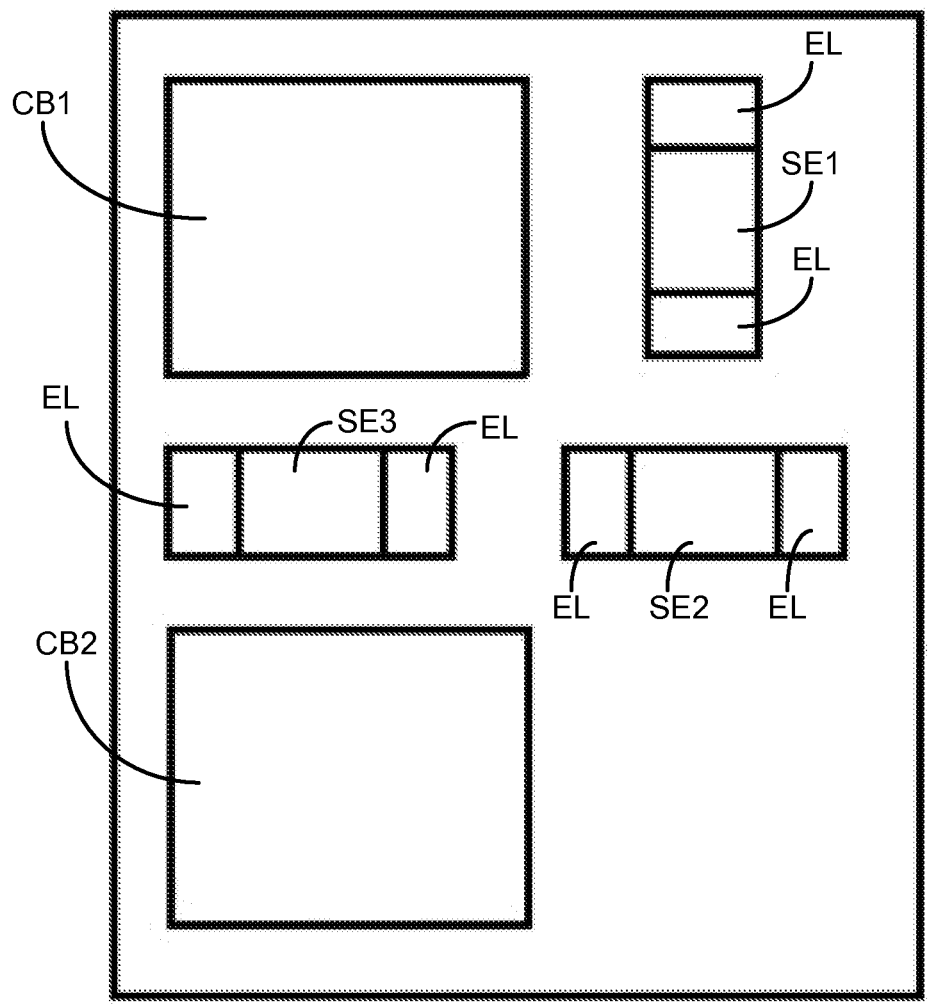
Figure 1C:
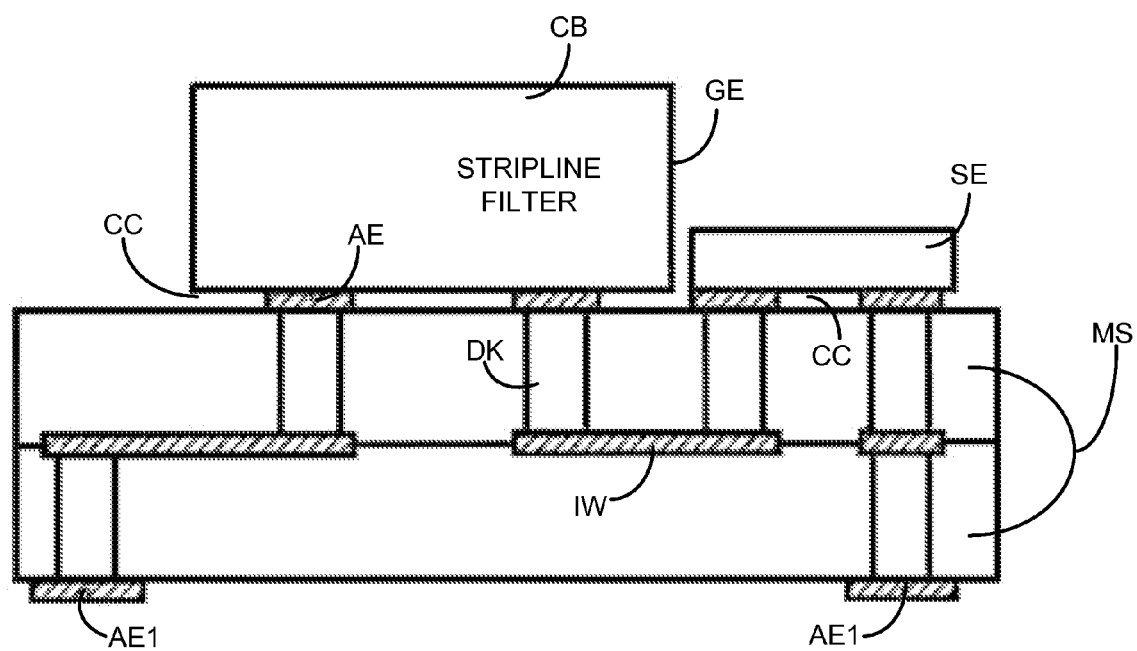

FIG. 1B shows a top view of a component having two chip components CB1 and CB2 and three discrete circuit elements SE1, SE2 and SE3. The discrete circuit elements contain electrodes EL.

The component described herein can have one or more signal inputs and/or outputs, wherein each individual signal input and/or signal output can be symmetrical or asymmetrical. In the case of symmetrical signal inputs and/or signal outputs, a coil and/or a capacitor between the two symmetrical signal lines may be added as additional basic elements.

Figure 2:
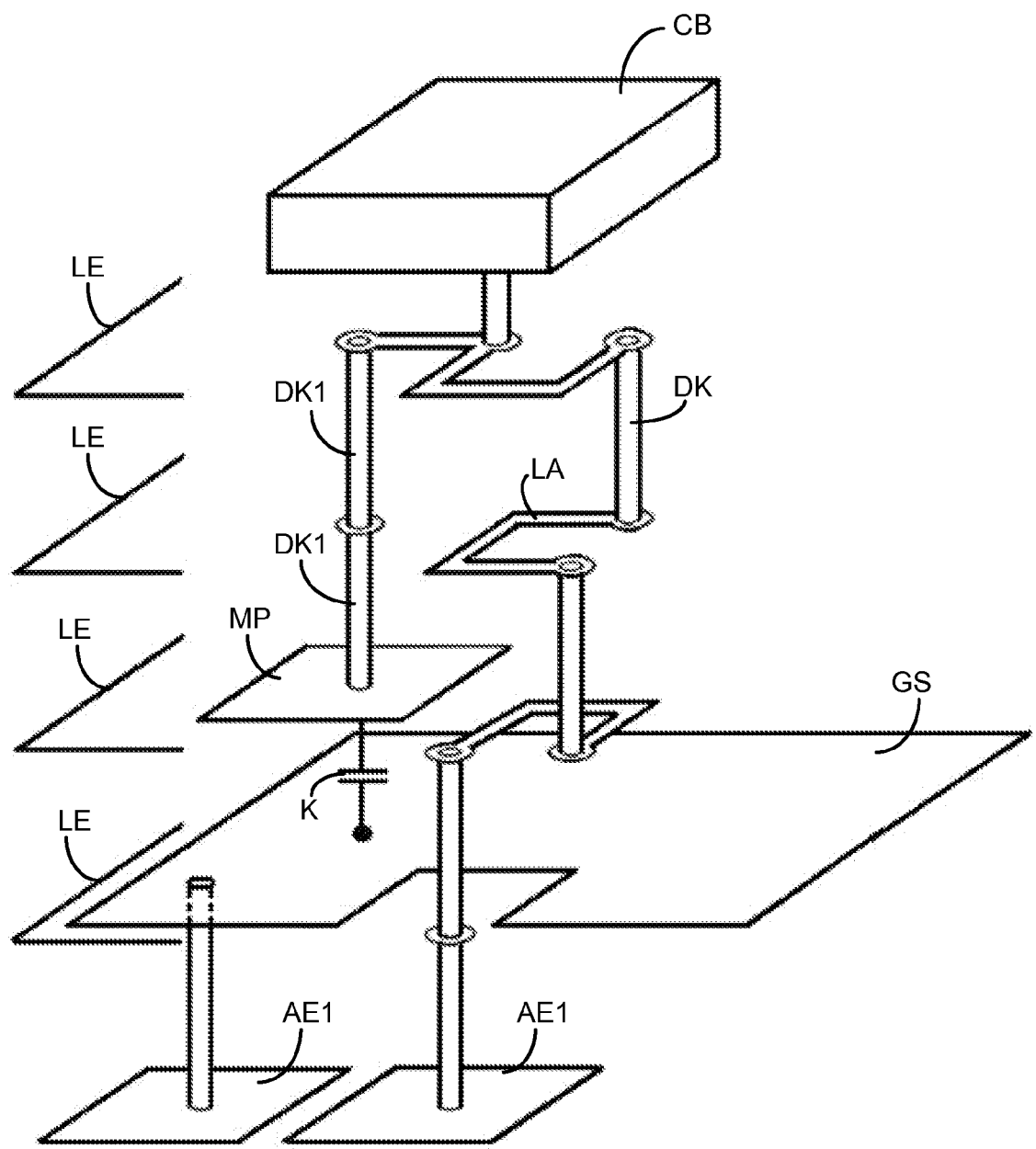
FIG. 2 shows an embodiment of a component having an integrated coil and an integrated capacitor.

In a further advantageous embodiment, a sheathed chip component (for example, a SAW chip, referred to in the following as a SAW filter) is disposed on the surface of a multi-layer substrate (for example, an LTCC of HTCC multi-layer ceramic) having an integrated impedance converter. The impedance converter comprises a series inductance, which is connected to the output of the chip component and/or of the SAW filter and connects it with an external electrode on the lower side of the multi-layer substrate. The external electrode is used to solder the complete component to a printed circuit board. The series inductance is achieved by means of structured strip conductors and/or strip conductor segments LA (as indicated in FIG. 2), which are disposed below an electric contact (external electrode of the chip component) suitable for soldering the chip component and/or the SAW filter. The strip conductors are separated from one another by dielectric layers of the multi-layer substrate. In this regard, the strip conductors of the individual conductor levels LE indicated to the left in FIG. 2 are connected with one another by means of feedthroughs DK1, so that a continuous coil winding results. In this regard, the chip component and/or the SAW filter may be disposed in such a way that its output electrode is located directly above the external electrode AE1 on the lower side of the multi-layer substrate. In a chip component operating with acoustic waves, the coil winding may be disposed underneath the chip component in such a way that it is not located directly below active filter structures of the chip component, otherwise, unwanted electromagnetic couplings would arise, which impair the electric component characteristics. For this reason, other integrated components of the impedance converter, especially in the uppermost layers of the multi-layer substrate, should be disposed, if possible, below the external contacts of the chip component and not below active structures of the chip component.

A ground shield GS located in the lowermost layer of the multi-layer substrate forms a capacity for the windings of the series inductance disposed above it, which constitutes an integrated coil. As a result, mirror currents are induced, which reduce the inductance value of the integrated coil. Larger inductance values can be achieved by maintaining a relatively large distance (e.g., at least 150 µm with strip conductors that are 100 µm wide) between the coil and the lower shield layer.

In the embodiment of the component shown in FIG. 2, its output impedance can be transformed from a higher to a lower impedance value. The underlying circuit comprises a series inductance (coil) connected to the output of the chip component and a capacitor to ground. The capacitor to ground is constructed as follows: A line is branched off at the terminal of the coil on the side of the chip component, this line being, for the most part, formed with feedthroughs DK1, so that this line progresses vertically downward in the multi-layer substrate and, at its end, contacts a metal plate MP, which is separated from the ground shield layer GS by only one dielectric layer, for example, forming a capacitor with the latter. The element identified by the reference symbol K is used here for explanatory purposes only.

In another embodiment, the chip component has a symmetrical output. The two contacts of the symmetrical output may be disposed directly and/or symmetrically above the corresponding external electrode on the lower side of the multi-layer substrate. The integrated coils, e.g., series coils, which are part of the integrated impedance converter, can be symmetrically or offset symmetrically coiled.

It is possible that a capacitor executed in the multi-layer substrate is connected between the two contacts of the symmetrical output of the chip component. In this regard, the contacts are connected with parallel metal plates disposed in lower layers by means of feedthroughs.

In another embodiment, an integrated impedance converter can contain a coil connected to ground. In this regard, one end of the coil is connected, on the one hand, to a ground shield surface, which, for example, is disposed in one of the lower layers of the multi-layer substrate, and, on the other hand, to an external electrode of the chip component by means of a feedthrough.

It is possible that the at least one chip component CB disposed on the upper side of the multi-layer substrate is mechanically stabilized with one or more circuit elements SE by means of a casting compound (CC in FIG. 1C), such as Globtop, e:g., with casting resin in an epoxy base.

The invention claimed is:

1. An electronic component comprising:
 a multi-layer substrate having an upper side and under side, the multi-layer substrate comprising at least one integrated impedance converter, the at least one integrated impedance converter comprising at least one inductor and at least one capacitor integrated in the multi-layer substrate, the multi-layer substrate comprising first external contacts on the under side; and
 at least one chip component comprising second external contacts, the at least one chip component being on the upper side of the multi-layer substrate, the at least one chip component being electrically connected to the at least one integrated impedance converter, the second external contacts being electrically connected to the first external contacts via an impedance conversion circuit that is at least partially integrated into the multi-layer substrate, the impedance conversion circuit comprising an inductive component that is electrically connected in series between the first external contacts and the second external contacts;
 wherein the at least one chip component comprises a bulk acoustic wave (BAW) resonator or a surface acoustic wave (SAW) resonator;
 wherein the at least one integrated impedance converter is configured to transform an impedance of the at least one chip component by 5% to 400%;
 wherein the at least one chip component comprises one or more inputs and outputs; and
 wherein at least one of the inputs or the outputs of the at least one chip component are for conducting a symmetrical signal.

2. The electronic component of claim 1, wherein the second external contacts comprise surface mounted device contacts.

3. The electronic component of claim 1, wherein the multi-layer substrate comprises at least one passive circuit element or at least one active circuit element.

4. The electronic component of claim 1, further comprising at least one filter circuit connected to the multi-layer substrate.

5. The electronic component of claim 1, further comprising at least one microwave ceramic filter connected to the multi-layer substrate.

6. The electronic component of claim 1, further comprising at least one inductive-capacitive (LC) chip filter connected to the multi-layer substrate.

7. The electronic component of claim 1, further comprising at least one stripline filter connected to the multi-layer substrate.

8. The electronic component of claim 1, further comprising:
 at least one discrete circuit element connected to the multi-layer substrate, the at least one discrete circuit element comprising an active circuit element or a passive circuit element.

9. The electronic component of claim 8, wherein the at least one discrete circuit element comprises at least a part of one of the following: a high-frequency circuit, an adjustment circuit, an impedance converter, an antenna circuit, a diode circuit, a high-pass filter, a low-pass filter, a band-pass filter, a band elimination filter, a power amplifier, a diplexer, a duplexer, a coupler, a directional coupler, a memory element, a balun, and a mixer.

10. The electronic component of claim 1, wherein the electrical component comprises a plurality of adjustment circuits.

11. The electronic component of claim 1, wherein the multi-layer substrate comprises ceramic layers.

12. The electronic component of claim 1, wherein the multi-layer substrate comprises layers of silicon or silicon oxide.

13. The electronic component of claim 1, wherein the multi-layer substrate comprises one or more layers of an organic material.

14. The electronic component of claim 1, wherein at least one input and/or at least one output of the at least one chip component is for conducting an asymmetrical signal.

15. The electronic component of claim 1, wherein the at least one chip component comprises a connection to ground, the connection to ground being made via an adjustment circuit that is at least partially integrated in the multi-layer substrate; and
  wherein the adjustment circuit comprises at least one of a coil, a capacitor and a conductor.

16. The electronic component of claim 8, wherein the at least one chip component and the at least one discrete circuit element comprise surface mounted elements.

17. The electronic component of claim 1, wherein the at least one chip component comprises a housing comprising the external contacts.

18. The electronic component of claim 1, wherein the at least one chip component is connected to the multi-layer substrate via wire bonding.

19. The electronic component of claim 1, wherein the at least one chip component is connected to the multi-layer substrate via flip-chip technology.

20. An electronic component comprising:
  a multi-layer substrate having an upper side and under side, the multi-layer substrate comprising at least one integrated impedance converter, the at least one integrated impedance converter comprising at least one inductor and at least one capacitor integrated in the multi-layer substrate, the multi-layer substrate comprising first external contacts on the under side;
  at least one chip component comprising second external contacts, the at least one chip component being on the upper side of the multi-layer substrate, the at least one chip component being electrically connected to the at least one integrated impedance converter, the second external contacts being electrically connected to the first external contacts via an impedance conversion circuit that is at least partially integrated into the multi-layer substrate, the impedance conversion circuit comprising an inductive component that is electrically connected in series between the first external contacts and the second external contacts; and
  at least one discrete circuit element connected to the multi-layer substrate, the at least one discrete circuit element comprising an active circuit element or a passive circuit element;
  wherein the at least one chip component comprises a bulk acoustic wave (BAW) resonator or a surface acoustic wave (SAW) resonator;
  wherein the at least one integrated impedance converter is configured to transform an impedance of the at least one chip component by 5% to 400%;
  wherein the at least one discrete circuit element comprises at least a part of a high-frequency circuit, a duplexer or a diplexer;
  wherein the at least one discrete circuit element is for assisting in connecting the at least one chip component to an antenna;
  wherein the at least one chip component comprises one or more inputs and outputs; and
  wherein at least one of the inputs or the outputs of the at least one chip component are for conducting a symmetrical signal.

21. The electronic component of claim 1, further comprising:
  at least one circuit element integrated in the multi-layer substrate, wherein the at least one circuit element comprises at least a part of one of the following: a high-frequency circuit, an adjustment circuit, an antenna circuit, a diode circuit, a high-pass filter, a low-pass filter, a band-pass filter, a band elimination filter, a power amplifier, a diplexer, a duplexer, a coupler, a directional coupler, a memory element, a balun, and a mixer.

22. An electronic component comprising:
  a multi-layer substrate having an upper side and under side, the multi-layer substrate comprising at least one integrated impedance converter, the at least one integrated impedance converter comprising at least one inductor and at least one capacitor integrated in the multi-layer substrate, the multi-layer substrate comprising first external contacts on the under side;
  at least one chip component comprising second external contacts, the at least one chip component being on the upper side of the multi-layer substrate, the at least one chip component being electrically connected to the at least one integrated impedance converter, the second external contacts being electrically connected to the first external contacts via an impedance conversion circuit that is at least partially integrated into the multi-layer substrate, the impedance conversion circuit comprising an inductive component that is electrically connected in series between the first external contacts and the second external contacts; and
  at least one circuit element integrated in the multi-layer substrate, wherein the at least one circuit element comprises at least a part of one of the following: a high-frequency circuit, an adjustment circuit, an antenna circuit, a diode circuit, a high-pass filter, a low-pass filter, a band-pass filter, a band elimination filter, a power amplifier, a diplexer, a duplexer, a coupler, a directional coupler, a memory element, a balun, and a mixer;
  wherein the at least one chip component comprises a bulk acoustic wave (BAW) resonator or a surface acoustic wave (SAW) resonator;
  wherein the at least one integrated impedance converter is configured to transform an impedance of the at least one chip component by 5% to 400%;
  wherein at least a part of an adjustment circuit is integrated in the multi-layer substrate and comprises one or more strip conductors on the upper side of the multi-layer substrate;
  wherein the at least one chip component comprises one or more inputs and outputs; and
  wherein at least one of the inputs or the outputs of the at least one chip component are for conducting a symmetrical signal.

23. A method of producing an electronic component comprising:
  providing (i) a multi-layer substrate having an upper side and under side, the multi-layer substrate comprising at least one integrated impedance converter, the at least one integrated impedance converter comprising at least one inductor and at least one capacitor integrated in the multi-layer substrate, the multi-layer substrate comprising first external contacts on the under side, and (ii) at least one chip component comprising second external contacts;

installing the at least one chip component in a housing; and mounting the housing onto the upper side of the multi-layer substrate so as to electrically connect the at least one chip component to the integrated impedance converter and so as to electrically connect the second external contacts to the first external contacts via an impedance conversion circuit that is at least partially integrated into the multi-layer substrate, the impedance conversion circuit comprising an inductive component that is electrically connected in series between the first external contacts and the second external contacts;

wherein the at least one integrated impedance converter is configured to transform an impedance of the at least one chip component by 5% to 400%;

wherein the at least one chip component comprises a bulk acoustic wave (BAW) resonator or a surface acoustic wave (SAW) resonator;

wherein the at least one chip component comprises one or more inputs and outputs; and wherein at least one of the inputs or the outputs of the at least one chip component are for conducting a symmetrical signal.

24. The method of claim 23, further comprising:

mounting at least one discrete circuit element on the upper side of the multi-layer substrate.

25. The method of claim 24, wherein the at least one chip component and the at least one discrete circuit element are attached to the upper side of the multi-layer substrate using a same attaching mechanism.

26. The method of claim 24, wherein the at least one chip component and/or the at least one discrete circuit element is mechanically stabilized using a casting compound.

* * * * *